United States Patent
Sasaki et al.

(10) Patent No.: US 7,348,264 B2
(45) Date of Patent: Mar. 25, 2008

(54) PLASMA DOPING METHOD

(75) Inventors: Yuichiro Sasaki, Tokyo (JP); Katsumi Okashita, Osaka (JP); Hiroyuki Ito, Chiba (JP); Bunji Mizuno, Nara (JP); Tomohiro Okumura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/741,861

(22) Filed: Apr. 30, 2007

(65) Prior Publication Data

US 2007/0190759 A1    Aug. 16, 2007

Related U.S. Application Data

(63) Continuation of application No. 11/647,149, filed on Dec. 29, 2006, which is a continuation of application No. PCT/JP05/22799, filed on Dec. 12, 2005.

(30) Foreign Application Priority Data

Dec. 13, 2004  (JP)  ............... 2004-360122
Apr. 26, 2005  (JP)  ............... 2005-128301

(51) Int. Cl.
*H01L 21/26*    (2006.01)
(52) U.S. Cl. .................. 438/513; 438/10; 438/17; 257/E21.147; 427/569
(58) Field of Classification Search ................ 438/513, 438/10, 17; 427/569; 257/E21.147
See application file for complete search history.

(56) References Cited

U.S. PATENT DOCUMENTS 4,912,065 A    3/1990  Mizuno et al.

(Continued)

FOREIGN PATENT DOCUMENTS

| JP | 04-368763 | 12/1992 |
|----|-----------|---------|
| JP | 05-36620 | 2/1993 |
| JP | 9-115852 A | 5/1997 |
| JP | 2000-114198 A | 4/2000 |
| JP | 3340318 | 8/2002 |
| JP | 2004-179592 A | 6/2004 |

(Continued)

OTHER PUBLICATIONS

Y. Sasaki et al.,"Helicon Wave Plasma Doping System," International Workshop on Junction Technology, 2002, pp. 37-38.*

(Continued)

*Primary Examiner*—B. William Baumeister
*Assistant Examiner*—Steven J. Fulk
(74) *Attorney, Agent, or Firm*—McDermott Will & Emery LLP

(57) ABSTRACT

A plasma doping method that can control a dose precisely is realized. In-plane uniformity of the dose is improved. It has been found that, if a bias is applied by irradiating $B_2H_6$/He plasma onto a silicon substrate, there is a time at which a dose of boron is made substantially uniform, and the saturation time is comparatively long and ease to stably use, compared with a time at which repeatability of an apparatus control can be secured. The invention has been finalized focusing on the result. That is, if plasma irradiation starts, a dose is initially increased, but a time at which the dose is made substantially uniform without depending on a time variation is continued. In addition, if the time is further increased, the dose is decreased. The dose can be accurately controlled through a process window of the time at which the dose is made substantially uniform without depending on the time variation.

12 Claims, 5 Drawing Sheets

U.S. PATENT DOCUMENTS

| | | | |
|---|---|---|---|
| 4,937,205 | A | 6/1990 | Nakayama et al. |
| 5,572,038 | A | 11/1996 | Sheng et al. |
| 5,711,812 | A | 1/1998 | Chapek et al. |
| 5,851,906 | A | 12/1998 | Mizuno et al. |
| 5,969,398 | A | 10/1999 | Murakami |
| 6,383,901 | B1 | 5/2002 | Chen |
| 6,531,367 | B2 | 3/2003 | Chen |
| 7,135,423 | B2 | 11/2006 | Downey |
| 2002/0187614 | A1* | 12/2002 | Downey .................. 438/407 |
| 2003/0153101 | A1* | 8/2003 | Takase et al. .............. 438/7 |
| 2004/0045507 | A1 | 3/2004 | Okumura et al. |
| 2004/0119025 | A1 | 6/2004 | Klepper et al. |
| 2004/0132260 | A1* | 7/2004 | Lenoble .................. 438/306 |
| 2004/0147070 | A1* | 7/2004 | Lei et al. ................. 438/199 |
| 2005/0170669 | A1 | 8/2005 | Okumura et al. |
| 2005/0277273 | A1 | 12/2005 | Sasaki et al. |
| 2005/0287776 | A1* | 12/2005 | Sasaki et al. ............ 438/510 |
| 2006/0006348 | A1 | 1/2006 | Yamazaki et al. |
| 2006/0097193 | A1 | 5/2006 | Horsky et al. |
| 2006/0264051 | A1 | 11/2006 | Thibaut |
| 2006/0280876 | A1* | 12/2006 | Yen et al. ................. 427/569 |
| 2006/0289799 | A1 | 12/2006 | Fang et al. |
| 2007/0020958 | A1 | 1/2007 | Okumura et al. |
| 2007/0023700 | A1 | 2/2007 | Koezuka et al. |

FOREIGN PATENT DOCUMENTS

| | | |
|---|---|---|
| JP | 2005-109453 | 4/2005 |
| WO | WO 2004051720 A1 * | 6/2004 |
| WO | WO 2004/109785 | 12/2004 |
| WO | WO2005/020306 | 3/2005 |

OTHER PUBLICATIONS

"International Technology Roadmap for Semiconductors 2001 Edition," Front End Processes, pp. 223-225, 2001 Semiconductor Industry Association.

"International Technology Roadmap for Semiconductors 2003 Edition," Front End Processes, Draft 6.1, Nov. 8, 2003, pp. 1-18.

Y. Sasaki et al., "$B_2H_6$ Plasma Doping with In-situ He Pre-amorphization," 2004 Symposium on VLSI Technology Digest of Technical Papers, pp. 180-181.

Jones, E. C., Cheung, N.W., "Plasma Doping Dosimetry", IEEE Transactions on Plasma Science, vol. 25, No. 1, Feb. 1997, pp. 42-52.

Mizuno et al., "New Methods for Ultra Shallow Boron Doping by Using Plasma—Plasma-Less and Sputtering", International Conferences on Solid State Devices and Materials, Aug. 1995, pp. 1041-1042.

Stetson, W.J., "Gas Dispersion Technique", IBM Technical Disclosure Bulletin, Feb. 1979, p. 3579.

Carabe, J. et al., "Microstructure of Thin Films Prepared by Plasma-Enhanced Chemical Vapor Deposition of Helium-Diluted Silane", Applied Surface Science Netherlands, Apr. 1999, vol. 143, No. 1-4, pp. 11-15.

Yamashita, F., et al., "Direct Joule Heating of Nd-Fe-B Based Melt-Spun Powder and Zinc Binder", 1999, IEEE.

Chu, P.K., et al., "Part one of two, Plasma Doping: Progress and potential", Solid State Technology, Sep. 1999, pp. 55-60, www.solid-state.com.

Chu, P.K., et al., "Part two of two, Plasma Doping: Progress and potential", Solid State Technology, Oct. 1999, pp. 77-82, www.solid-state.com.

Hori, A., et al., "CMOS Device Technology toward 50 nm Region—Performance and Drain Architecture—", IEDM, 1999, pp. 641-644, IEEE.

Kwok, Dixon T.K., et al., "Energy distribution and depth profile in $BF_3$ plasma doping", Surface and Coatings Technology, 2001, pp. 146-150, vol. 136, Elsevier Science B.V.

Yamashita, F., et al., "Nd-Fe-B Thin Arc-shaped Bonded Magnets for Small DC Motors Prepared by Powder Compacting Press with Ion-Implanted Punches", J. Mgn. Soc. Japan, 2001, pp. 683-686, vol. 25 No. 4-2.

Yamashita, F., et al., "Preparation of a Solid Rotor Composed of a Highly Dense Ring-Shaped RE Bonded Magnet and an Iron-Dust Core", Trans. Magn. Soc. Japan., 2002, pp. 111-114, vol. 2 No. 3.

Mizuni, B., "Ultra Shallow Junction for sub-50NM CMOS—The role of Plasma Doping-", UJTLab, pp. 10-13, Ultimate Junction Technologies Inc.

Sasaki, Y., et al., "$B_2H_6$ Plasma Doping with In-situ He Pre-amorphization", Symposium on VLSI Technology Digest of Technical Papers, 2004, pp. 180-181, IEEE.

Sasaki, Y., et al., "Plasma Doped Shallow Junction Formation", Matsushita Technical Journal, Dec. 2004, pp. 404-409, vol. 50 No. 6.

Tsutsui, K., et al., "Doping Effects from Neutral $B_2H_6$ Gas Phase on Plasma Pretreated SI Substrates as a Possible Process in Plasma Doping", The Japan Society of Applied Physics, 2005, pp. 3903-0907, vol. 44 No. 6A.

Mizuno, B., et al., "De-Excitation Pathways of highly-Excited Self-Trapped Exciton and Electron Plus Self-Trapped Hole", Journal of the Physical Society of Japan, Jun. 1983, pp. 1901-1903, vol. 52 No. 6.

Mizuno, B., "Excitation-Induced Atomic Motion of Self-Trapped Excitons in RbCl: Reorientation and Defect Formation", Journal of the Physical Society of Japan, Sep. 1986, pp. 3258-3271, vol. 55 No. 9.

Mizuno. B., et al., "Effect of Hydrogen on Oxygen Removal from Silicon-Overlayer on Insulator formed by $O^+$ Implantation", pp. 637-640, Semiconductor Research Center, Matsushita Electric Industrial Co., Ltd.

Fujita, T., et al., "Electron Paramagnetic Resonance Studies of Defects in Oxygen-Implanted Silicon", Jaanese Journal of Applied Physics, Jul. 1987, pp. L1116-L1118, vol. 26 No. 7.

Mizuno, B., et al., "Effective removal of oxygen from Si layer on burned oxide by implantation of hydrogen", J. Appl. Phys., Sep. 1987, pp. 2566-2568, vol. 62 No. 6.

Mizuno, B., et al., "New doping method for subhalf micron trench sidewalls by using an electron cyclotron resonance plasma", Appl. Phys. Lett., Nov. 1988, pp. 2059-2061, vol. 53 No. 21, American Institute of Physics.

Shimizu, N., et al., "Reduction of Thickness Secondary Defects in MeV Ion Impalted Silicon by Intrinsic Gettering", Extended Abstracts of the 21st Conference on Solid State Devices and Materials, Tokyo, 1989, pp. 177-180.

Hori, A., et al., "A 0.05 μm-CMOS with Ultra Shallow Source/Drain Junctions Fabricated by 5KeV Ion Implantation and Rapid Thermal Annealing", 1994, pp. 485-488, IEDM.

Hori, A., et al., "Fabrication and Characteristics of a Room Temeprature 0.05 μm-CMOS—Possibility and Design Concept of Sub-0.1 μm MOS Devices-", Technical Report of IEICE, 1995, pp. 41-46, The Institute of Electronics, Information and Communication Engineers.

Mizuno, B., et al. "Plasma doping for silicon", Surface and Coatings Technology, 1996, pp. 51-55, vol. 85, Elsevier Science S.A.

Mizuno, B., et al., "Plasma Doping of Boron for Fabricating the Surface Channel Sub-quarter micron PMOSFET", Symposium on VLSI Technology Digest of Technical Digest of Technical Papers, 1996, IEEE.

Takase, M., et al., "An evaluation method for a high concentration profile produced in very low energy doping processes", Nuclear Instruments and Methods in Physics Research, 1997, pp. 288-290, vol. 121, Elsevier Science B.V.

Takase, M., et al., "Suppressing Ion Implantation Induced Oxide Charging by Utilizing Physically Damaged Oxide Region", Jpn. J. Appl. Phys., Mar. 1997, pp. 1618-1621, vol. 36, Part 1, No. 3B.

Mizuno. B., et al., "Plasma Doping", pp. 165-170, Central Research Laboratory, Matsushita Electric Industrial Co., Ltd.

Kadokura, M., et al., "Analysis and Design Of At-Cut Quartz Resonators by three dimensional finite element method", EEP-vol. 19-1, Advances in Electronic Packaging, 1997, pp. 1101-1108, vol. 1, ASME 1997.

Mizuno, B., et al., "Plasma Doping and Plasma-Less Doping of Semiconductor", Mat. Res. Soc. Symp. Proc., 1997, pp. 345-950, vol. 438, Materials Research Society.

Takase, M., et al, "New Doping Technology-Plasma Doping—for Next Generation CMOS process with Ultra Shallow Junction—LSI Yield and surface contamination issues—", 1997, pabes B9-B12, IEEE.

Takase, M., et al., "Shallow Source/Drain Extensions for pMOSFETs with High Activation and Low Process Damage Fabricated by Plasma Doping", IEDM, 1997, pp. 475-478, IEEE.

Jin, C.G., "Hard X-ray Photoelectron spectroscopy (HX-PES) study on chemical binding states of ultra shallow plasma-doped silicon layer for the application of advanced ULSI devices", 2006, pp. 116-119, IEEE.

Mizuno, B., et al., "Plasma Doping and Subsequent Rapid Thermal Processing for Ultra Shallow Junction Formation", 13th IEEE International Conference on Advanced Thermal Processing of Semiconductors—RTP, 2005, IEEE.

Mizuno, B., et al., "Plasma Doping", 2004, pp. 423-427, IEEE.

Sasaki, Y., et al., "Gas Phase Doping at Room Temperature", Extended Abstract of International Workshop on Junction Technology, 2002, pp. 39-40, Japan Society of Applied Physics.

Sasaki, Y., et al., "Helicon Wave Plasma Doping System", Extended Abstract of International Workshop on Junction Technology, 2002, pp. 37-38, Japan Society of Applied Physics.

Jin, C.G., et al., "Estimation of Ultra-Shallow Plasma Doping (PD) Layer's Optical Absorption Properties by Spectroscopic Ellipsometry (SE)", 2004, pp. 102-103, IEEE.

Shimizu, N., et al., "Secondary Defect Reduction by Multiple MeV Boron Ion Implantation", Extended Abstract of the 22nd (1990 International) Conference on solid State Devices and Materials, Sendal, 1990, pp. 449-452.

Sasaki, Y., et al., "New method of Plasma doping with in-situ Helium pre-amorphization", Nuclear Instruments and Methods in Physics Research B 237, 2005, pp. 41-45, ELSEVIER B.V.

Jin, C.G., "Ultra shallow p$^+$/n junction formation by plasma doping (PD) and long pulse all solid-state laser annealing (ASLA) with selective absorption modulation", Nuclear Instruments and Methods in Physics Research B 237, 2005, pp. 58-61, ELSEVIER B.V.

Mizuno, B., et al., "Plasma Doping and Plasma-Less Doping for SI: Application to the sub-quarter micron Surface Channel PMOSFET and Solid Plasma Source Application for Safety Operation", Semiconductor Research Center, Matsushita Electric Industrial Co., Ltd.

Liu, H., et al., "A New Plasma-Aided Solid-Source Implantation Method for Ultra-Shallow p+/n Junction Fabrication", Engineering Research Center for Plasma-Aided Manufacturing, University of Wisconsin-Madison.

Mizuno, B., "Plasma Doping into the Side-Wall of a Sub-0.5 μm Width Trench", Extended Abstracts of the 19th Conference on Solid State Devices and Materials, Tokyo, 1987, pp. 319-322.

Mizuno, B., "Plasma Doping Technology", Applied Physics, 2001, pp. 1458-1462, vol. 70.

Takase, M., et al., "Shallow Source/Drain Extensions for pMOSFETs with High Activation and Low Process Damage Fabricated by Plasma Doping", Technical Report of IEICE, 1998, The Institute of Electronics, Information and Communication Engineers.

Mizuno, et al., "Ultralow Energy Doping Plasma Doping", Special Issue—Currently Developed Ion Engineering Technology-1.

Mizuno, B., et al., "Plasma Based Ion Implantation—Plasma Doping", High Temperature Science Journal, May 1996, pp. 114-120, vol. 3 No. 22.

Tatsumi, T., et al., "Multilevel Interconnection Technology using Fluorinated Amorphous Carbon films", 3p-ZX-3, Silicon Systems Research Laboratories, NEC Corporation.

Mizuno. B., et al., Plasma doping for fabricating ultra shallow junction, 3p-ZX-4, Matsushita Electric Industrial Co., Ltd.

Oda, H., et al., "Demand for Junction Technology in CMOS Transistors", 27a-ZL-1, 49th Applied Physics Lecture Series—Lecture Manuscripts, Comprehensive Lectures within the Area, 2002, Tokai University.

Mizuno, B., et al., "Junction Technologies: Status Quo and Perspectives", 27a-ZL-2, Comprehensive Lectures within the Area.

Hata, N., et al., "Characterization of Low-k Dielectrics by Z-ray Scattering- Anisotropy in Pore Diameter and its Suppression", 26p-M-19, 63rd Applied Physics Lecture Series—Lecture Manuscripts, 2002, Nilgaka University.

Shimanuki, J., et al., "Behavior of pores in a thin low-k film during anneal—Ex-situ TEM observation method", 26p-M-20.

Sasaki, Y., et al., "In-situ Beam Current Monitor for Ion Implanter", 25a-G-1, pp. 768.

Higaki, R., et al., "Plasma Doping and Plasma Assisted Gas Doping", 25a-G-2, 63rd Applied Physics Lecture Series—Lecture Manuscripts, 2002, Niigaka University.

Kurosawa, J., et al., "Development of Ni-B-P-Pt type liquid metal Ion source for formation of Ni-nano dopant array by single Ion implantation", 25a-G-3, 63rd Applied Physics Lecture Series—Lecture Manuscripts, 2002, Niigaka University.

Imamura, K., et al., "Development of key-techniques for co-doping of acceptor and donor by single ion implantation", 25a-G-4, 63rd Applied Physics Lecture Series—Lecture Manuscripts, 2002, Niigaka University.

Yamashita, K., et al., "Development of Flash Lamp Annealer for 300 mm Wafers", 29p-ZW-10, 50th Applied Physiscs Lecture Series—Lecture Manuscripts, 2003, Shinagawa University.

Kubo, Y., et al., "Development of advance single ion implantor", 29p-ZW-11, 50th Applied Physiscs Lecture Series—Lecture Manuscripts, 2003, Shinagawa University.

Higaki, R., et al., "Dose Control of gas Phase Doping at Room Temperature" 29p-ZW-12, 50th Applied Physiscs Lecture Series—Lecture Manuscripts, 2003, Shinagawa University.

Akama, S., et al., "The Surface Reaction mechanism of Gas Phase Doping at Room Temperature", 29p-ZW-13, 50th Applied Physiscs Lecture Series—Lecture Manuscripts, 2003, Shinagawa University.

Sasaki, Y., et al., "Behavior of H and contamination in the Plasma Doping (PD) process", 29p-ZW-14, 50th Applied Physiscs Lecture Series—Lecture Manuscripts, 2003, Shinagawa University.

Kurobe, K., et al., "Ultra-shallow n+/p Junction Formation by Heat-assisted Excimer Laser Annealing", 29p-ZW-15, 50th Applied Physiscs Lecture Series—Lecture Manuscripts, 2003, Shinagawa University.

Fujinami, M., et al., "Research in Pores and Oxygen Compound Deficits in Si Due to the Positron Annihilation Coincidence Doppler Broadening Method, Positron Annihilation Coincidence Doppler Broadening Methods for Vacancy-Oxygen Complexes in Si", 1a-A-8, 64th Applied Physics Lecture Series—Lecture Manuscripts, 2003, Fukuoka University.

Miyagoe, T., et al., "Behavior Research on Deficits in Noble Gas Ion Implanted Si Using a Positron Beam, Positron beam study of defects induced by noble gas implanted Si", 1a-A-9, 64th Applied Physics Lecture Series—Lecture Manuscripts, 2003, Fukuoka University.

Higaki, R., et al., "Effects on the Substrate Surface conditions with Gas Doping Having Used Plasma Preprocessing, Effects of substrate surface condition on gas-phase doping using plasma pretreatment", 1a-A-10, 64th Applied Physics Lecture Series—Lecture Manuscripts, 2003, Fukuoka University.

Itoh, H., et al., "Ultra-low energy ion implantation in Si II", 30p-ZQ-9, Preprints of the 67th Meeting of the Japan Society of Applied Physics, 2006, Ritsumeikan University.

Matsuda, T., et al., "Spike RTA Induced Changes in Chemical Bondings and Their Depth Profile of Plasma-doped Boron", 30p-ZQ-10, Preprints of the 67th Meeting of the Japan Society of Applied Physics, 2006, Ritsumeikan University.

Tanaka, Y., et al., "8nm (5E18cm$^{-2}$) Ultra Shallow Junction Formation by Double-Pulsed Laser Annealing", 30p-ZQ-11, Preprints of the 67th Meeting of the Japan Society of Applied Physics, 2006, Ritsumeikan University.

Haya, A., et al., "Surface Modification of Plastic Substrate by Atomic Hydrogen Anneal and Effect of AHA to Film Deposition", 29p-SM-1, Preprints of the 54th Meeting of the Japan Society of Applied Physics and Related Societies, 2007, Aoyama Gakuim University.

Ohashi, Y., et al., "Effects of Hydrogenation on Chemical Activity of Defects in Polycrystalline Silicon Thin films", 29p-SM-2, Preprints of the 54th Meeting of the Japan Society of Applied Physics and Related Societies, 2007, Aoyama Gakuin University.

Watanabe, M., et al., "Study of Activated Boron Depth Profiles and Ultra-Shallow P+ Layers Formed by Plasma Doping Method", 29p-SM-3, Preprints of the 54th Meeting of the Japan Society of Applied Physics and Related Societies, 2007, Aoyama Gakuin University.

Ishiba, T., et al., "Lattice Strains in High Energy Ion Implated Silicon Subjected to Thermal Annealings", 27a-SN-13.

Shimizu, N., et al., "Secondary Defect Reduction of Multiple MeV Ion Implatation (II)", 27a-SN-14.

Nakata, J., "The Low-Temperature Crystallization and Amorphization Mechanism of Amorphous Si by High Energy Heavy-Ion Beam Irradiation", 27a-SN-15.

Matsumoto, M., "The Influence of Pre-oxidation Cleaning on Grotwh of Oxide Film (II)", 28a-D-1.

Uchida, H., et al., "Influence of Cleaning methods on Dielectric Breakdown in Thin $Sio_2$" 28a-D-2.

Takiyama, M., et al., "Electrical Characteristics of Al MOS Diode Contaminated with Cu-I", 28a-D-3.

Shimizu, N., et al., "Secondary Defect Reduction of Multiple MeV Ion Implantation (III)", 31a-X-5.

Kimoto, K., et al., "Rapid Thermal Annealing for High-energy Ion Implanted Si (V)" 31a-X-6.

Koyama, Y., et al., "Rapid Thermal Annealing for High-energy Ion Implanted Si (VI)" 31a-X-7.

Suzuki, H., et al., "Preamorphization by si Double Ion Implantation", 9p-C-12.

Takamatsu, H., et al., "Evaluation of Anneal Effect by Photoacoustic Displacement Measurement", 9p-C-13.

Shimizu, N., et al., "Effects of Junction Leakage Current Reduction of Additional High Energy Si Ion Implantation", 9p-C-14.

Katsumoto, M., et al., "The Effect of NH40H/H202 Cleaning on C-V Characteristics of MOS Capacitor", 11p-B-12.

Shinno, H., "Ellipsometric Measurements of Silicon Surfaces During Oxidation in R.F. Plasma", 11p-B-13.

Maekawa, M., et al., "Effect of H2SO4 Boiling on Silicon Surface", 11p-B-14.

Mizuno, B., et al., "Plasma-assisted Impurity Doping for ULSIs", 28p-ZP-10.

Itatani, R., "Introductory Talk, Matrial Processing Induced by Electron Beam", 28p-ZQ-1.

Tanimura, S., et al., D-255 Total Management System for VLSI Manufacturing, 1994 Spring Conference of the Institute of Electronics, Information and Communications Engineers, Matsushita Electric Industrial Co., Ltd.

Maekawa, T., et al., "Annealing of $Ar^+$ Implanted Damage" 30p-ZK-3.

Okahisa, M., et al., "Electrical Properties of High Energy Boron-implanted Layers in Si", 30p-ZK-3.

Shimizu, N., et al., "Effects of n+ Layer Formation on Junction Leakage Current Using High Energy Ion Implantation", 30p-ZK-4.

Kinoshita, K., et al., "Optical Property Change of Silicon in Low Energy Ion Implantation (II)", 28a-ZW-8.

Mizuno, B., et al., "A Sputtering Effect During the Ion Implantation with Low Energy", 28a-ZW-9.

Kagawa, K., et al., "Effect of Charging During Ion Implantation on Devices", 28a-ZW-10.

Murakoshi, A., et al., "Formation of Ultra Shallow Diffusion Layer by Ultra Low Energy Ion Implantation", 26p-ZN-10.

Mizuno, B., et al., "Plasma Doping Method", 26 p-ZN-11.

Fukuda, K., et al., "Fabrication of Ultra Shallow Junction by Spin-on Glass $SiO_2$ Film" 26p-ZN-12.

Ishii, M., "Quantitative Analysis of rare-Gas Ion Bombardment Damage of Si Surface using XPS", 26p-ZP-6.

Takase, M., et al., "Evaluation Method of Hifh concentration Profile for Low Energy Ion Implantation", 26p-ZP-7.

Nakamura, T., "Influence of simultaneously implanted As+ ions on diffusivity and activation efficency of B atoms implanted into silicon", 26p-ZP-8.

Akiyama, H., et al., "The life-time control technique for power devices using high-energy heavy ion radiation", 28a-P-6.

Takase, M., et al., "The Identification of the Region of Ion Implantation Induced Physical Damaged Layer", 28a-P-7.

Tamura, F., et al., "Measurement of the minority carrier lifetime for the Si epitaxial layer", 28a-P-8.

Mizuno, B., et al., "Room Temperature Vapor Phase Doping (RTVD)", 28p-P-4.

Mizuno, B., et al., "Plasma Doping Applicable to sub-1/4 micron PMOS", 28p-P-5.

Kujirai, H., et al., "Ultra-shallow, low resistance junction formation by solid-phase diffusion of boron from BSG", 28p-P-6.

Takase, M., et al., "Dosage Control by Plasma Emission in Plasma Doping Process", 7a-P-2.

Murakami, E., et al., "Formation of Ultrashallow Junctions by Sb Selective δ Doping Technique", 7a-P-3.

Kiyota, Y., et al., the Role of Hydrogen during Rapid Vapor-phase Doping Analyzed by FTIR-ATR, 7a-P-4.

Takase, M., et al., "Fabrication of Low Sheet Resistance and Shallow Source/Drain Junction with Plasma Doping Process", 29a-G-2.

Shimada, N., et al., "Shallow Junction, Formation by Polyatomic Cluster Ion Implantation", 29a-G-3.

Ishikawa, T., et al., "Formation of shallow junctions by low-energy implantation", 29a-G-4.

Shimada, N., et al., "Shallow Junction Formation by Decaborane Ion Impantation (IV)", 3a-PC-13.

Mineji, A., et al., "Shallow Junction Formation by 0.2 keV-single B Ion Implantation", 3a-PC-14.

Takase, M., et al., "High Activation Ultra Shallow Source/Drain Junction Fabricated by Plasma Doping", 3a-PC-15.

Nishida, S., et al., "the Herzog correction revisited", 7a-YP-8.

Ono, S., et al., "Design of a cryogenic current measuring device using a SQUID for low-intensity beams", 7a-YP-9.

Haruyama, Y., et al., "High resolution measurement of $HeH^+$ dissociative recombination with superconductor electron cooler", 7a-YP-10.

Tsurubuchi, S., et al., "Excitation cross sections for the resonance states of the Ne by electron impact", 7a-YP-11.

Wakabayashi, et al., "IEDM Focusing on high speed and low electric power techniques, Finally the Cu damascene technique for practical applications has arrived", IEDM Conference, 1997, IEEE.

Nakata, K., et al., "Fall Bit map Correlation Analysis System", The Institute of Electronics, Information and Communication Engineers (IEICE) Electronics Society Annual Meeting, 1995.

Tsubo, Y., et al., "Diffusion of Phosphorus from P-doped Polysilicon through Ultrathin siO2 into Si Substrate", 30p-ZP-11.

Aoyama, T., et al., "Boron Diffusion in Silicon Dioxide in the Presence of Hydrogen and Fluorine", 30p-ZP-12.

Takase, M., et al., "Effect of oxide thickness on boron profile in the plasma doping process", 30p-ZP-13.

Mizuno, B., et al., "Plasma Doping", Invitational Lecture.

Takase, M., et al., "Plasma doping Technology for the MOS transistor with a channel length below 0.15 μm", Applied Physics, 1999, vol. 68 No. 5.

Sasaki, Y., et al., "Nondestructive Beam Current Monitor Using DC SQUID", pp. 68-76.

Kobayashi, K., et al., "Three-Dimensional Plasma Doping for Beam-Channel Transistor", 29p-ZG-13, Preprints of the 51st Spring meeting of the Japan Society of Applied Physics and Related Societies, Mar. 2004, Tokyo University of Technology.

Sato, T., et al., "Effect of wet cleaning treatment on dose of impurity after plasma doping", 29p-ZG-14, Preprints of the 51st Spring meeting of the Japan Society of Applied Physics and Related Societies, Mar. 2004, Tokyo University of Technology.

Takagi, K., et al., "Profile control by Helium plasma treatment in plasma doping method", 29p-ZG-15, Preprints of the 51st Spring meeting of the Japan Society of Applied Physics and Related Societies, Mar. 2004, Tokyo University of Technology.

Okahita, K., et al., "In-situ Plasma Pre-amorphization for Shallow Junction Formation", 3p-P10-14, Preprints of the 65th Meeting of the Japan Society of Applied Physics and Related Societies, Sep. 2004, Tohoku Gakuin University.

Nakazawa, H., et al., "Characterization of Boron/Phosphorus Layer by Cold/Heat Ion Implantation", 3p-P10-15, Preprints of the 65th Meeting of the Japan Society of Applied Physics and Related Societies, Sep. 2004, Tohoku Gakuin University.

Kobayashi, K., et al., "Doping Profile Evaluation for Three-Dimensional Transistor", 3p-P10-16, Preprints of the 65th Meeting of the Japan Society of Applied Physics and Related Societies, Sep. 2004, Tohoku Gakuin University.

Otakagi, K., et al., "Effect on Impurity profile of Helium Plasma Treatment on a Plasma Doping Method", 65th Japan Society of Applied Physics Symposium Collection of Lectures, Sep. 2004, Tohoku Graduate Department.

Sauddin, H., et al., "Leakage Current in Mesa-type p+/n, Junctions Formed by Plasma Doping", 10a-A-10, PerPreprints of the 66th Meeting of the Japan Society of Applied Physics, 2005, Tokushima University.

Fukagawa, Y., et al., "Electrical Properties of ultra-Shallow p+ Layers Formed by Plasma Doping", 10a-A-11, PerPreprints of the 66th Meeting of the Japan Society of Applied Physics, 2005, Tokushima University.

Matsuda, T., et al., "Chemical Bonds of Boron Atoms Implanted in A Silicon Surface by Plasma Doping", 10a-A-12, PerPreprints of the 66th Meeting of the Japan Society of Applied Physics, 2005, Tokushima University.

Mizuno, B., et al., "Reduction of lattice defect in Si layer on buried oxide by implantation of hydrogen,", SDM 87-169, Basic Research Lab., Semiconductor Research Center, Matsushita Electric Industrial Co., Ltd.

Mizuno, B., et al., "ECR Plasma Doping", SDM 88-95, Semiconductor Research Center, Semiconductor Basic Research Lab., Matsushita Electric Industrial Co., Ltd.

Mizuno, B., et al., "ECR Plasma Doping", Electrical Material, Dec. 1987.

Mizuno, B., "Plasma Doping Technology", Semiconductor Research Center, Matsushita Electric Industrial Co., Ltd.

Nakada, K., et al., "D-259 Development of Cleanroom Auto Control System", 1994 Spring Conference of the Society of Electronic Information and Communications.

Mizuno, B., et al., "Behavior of Implanted Ions Near the Surface—Outer Diffusion and Self-sputtering", 28p-ZL1.

Yamanishi, Y., et al., "Behavior during Oxidation of Nitrogen Introduced by Ion Implantation", 28p-ZL2, Zaizu, Y., et al., "Effects of Silicon Nitride Films on Boron Enhanced Diffusion and Crystalline Defects due to Boron Implantation", 28p-ZL3.

Mizuno, B., et al., "Behavior near Surface of Implanted Ions (cont'd) Self-sputtering and Back-scattering", 20p-ZE-11.

Kinoshita K., et al., "Optical Changes in Association with Crystalline Damage due to Low Energy Ion Implantation (IV)", 20p-ZE-12.

Hasegawa, K., et al., "Dual Species (B, As) Implantation in Silicon", 28p-ZE-13.

Sato, T., et al., "Dose Volume changes and HF Cleansing Before and After Plasma Doping Change dose caused by HF treatment before and after plasma doping", 1a-A-11, 64th Applied Physics Lecture Series- Lecture Manuscripts, 2003, Fukuoka University.

Susuki, K., "High Tilt Angle Ion Implantation In Polycrystalline Si, High tilt angle Ion Implantation into Polycrystalline silicon", 1p-A-1, 64th Applied Physics Lecture Series- Lecture Manuscripts, 2003, Fukuoka University.

Yamada, M., et al., "Evaluation of Junction Leak Current Caused by Element Isolation Stress, Study of junction leakage currents induced by the stress of shallow trench isolation", 1p-A-2, 64th Applied Physics Lecture Series-Lecture Manuscripts, 2003, Fukuoka University.

Aiba, I., et al., "Dose Variation by Chemical Cleaning Process after Plasma Doping", 3p-P10-18, 65th Japan Society of Applied Physics Symposium Collection of Lectures, Sep. 2004, Tohoku Graduate Department.

Majima, M., et al., "Hall Effect Measurement of ultra Shallow $p^+n$ Junctions formed by Plasma Doping", 3p-P10-19, 65th Japan Society of Applied Physics Symposium Collection of Lectures, Sep. 2004, Tohoku Graduate Department.

Masuda, T., et al., "Amorphization of Large-scale Silicon Substrate by using hybrid Quantum Chemical Molecular Dynamics Method", 1a-YE-7, 52nd Japan Society of Applied Physics Symposium Collection of Lectures, 2005, Saitama University.

Fukugawa, Y., et al., "Examination of pre-amorphous layer formation process by He plasma Irradiation", 1a-YE-8, 52nd Japan Society of Applied Physics Symposium Collection of Lectures, 2005, Saitama University.

Aiba, I., et al., "Plasma Doping on Si substrates with Resist Patterns", 1a-YE-9, 52nd Japan Society of Applied Physics Symposium Collection of Lectures, 2005, Saitama University.

Okashite, K., et al., "Ultra Shallow Junction Formation with Plasma Doping and Spike RTA", 1a-YE-10, 52nd Japan Society of Applied Physics Symposium Collection of Lectures, 2005, Saitama University.

Sauddin, H., "Leakage Current Characteristics of Ultra-shallow p+/n Junctions Formed by Plasma Doping", 1a-YE-11, 52nd Japan Society of Applied Physics Symposium Collection of Lectures, 2005, Saitama University.

Matsuno, A., et al., "One Dimensional Thermal Diffusion Simulation for the USJ formation by green laser anneal with absorption layer", 16-YE-1, 52nd Japan Society of Applied Physics Symposium Collection of Lectures, 2005, Saitama University.

Mizuno, B., et al., "ECR Plasma Doping", Matsushita Electric Industrial Co., Ltd.

Higaki, R., et al., "Effects of gas phase absorption into Si substrates on plasma doping process".

Lenoble, D., et al., "Fabrication of 60-nm plasma doped CMOS transistors", 2002, IEEE.

Ito, T., et al., "Improvement of Threshold Voltage Roll-off by Ultra-shallow Junction Formed by Flash Lamp Annealing", 2003, Symposium on VLSI Technology Digest of Technical Papers.

Seversi, S., et al., "Diffusion-less junctions and super halo profiles for PMOS transistors formed by SPER and FUSI gate in 45nm physical gate length devices", 2004, IEEE.

\* cited by examiner 174.6  213.4

CONTOUR LINE HAS 2% (3.88 ohm / sq) PITCH, $B_2H_6$ / He 0.1% / 99.9%,
SP 1500 W, BP 77 W (Vdc 60 V), PRESSURE 0.9 Pa, 60 seconds,
AVERAGE 194.0 ohm / sq, MAXIMUM 200.6 ohm / sq, MINIMUM 184.8 ohm / sq,
$1\sigma = 2.25\%$ 133.1  162.7

CONTOUR LINE HAS 2% (2.96 ohm / sq) PITCH, $B_2H_6$ / He 0.2% / 99.8%,
SP 1500 W, BP 77 W (Vdc 60 V), PRESSURE 0.9 Pa, 45 seconds,
AVERAGE 147.9 ohm / sq, MAXIMUM 156.4 ohm / sq, MINIMUM 141.2 ohm / sq,
$1\sigma = 2.42\%$

PLASMA DOPING METHOD

RELATED APPLICATIONS

This application is a continuation of U.S. patent application Ser. No. 11/647,149, filed Dec. 29, 2006, which is a continuation of International Application No. PCT/JP05/22799, filed Dec. 12, 2005, which in turn claims the benefit of Japanese Application Nos. 2004-360122, filed on Dec. 13, 2004, and 2005-128301, filed Apr. 26, 2005, the disclosures of which Applications are incorporated by reference herein.

BACKGROUND OF THE INVENTION

1. Background of the Invention

The present invention relates to a plasma doping method, and in particular, to a plasma doping method for doping an impurity into a surface of a solid sample such as a semiconductor substrate.

2. Description of the Related Art

As a technology for doping an impurity into a surface of a solid sample, a plasma doping (PD) method for ionizing the impurity and doping the ionized impurity into a solid at low energy is well known (for example, see U.S. Pat. No. 4,912,065).

On the other hands, among the methods for doping an impurity, an ion implantation method is most widely used at present. The plasma doping method is described in "Column of Shallow Junction Ion Doping of FIG. 30 of Front End Process in International Technology Roadmap for Semiconductors 2001 Edition (ITRS2001)" and "International Technology Roadmap for Semiconductors 2003 Edition (ITRS2003)" as a next-generation technology for implanting ion. The plasma doping method is different from the ion implantation method. Moreover, ITRS is a document that is widely referred to by engineers in semiconductor industries A technical difference between ion implantation and plasma doping will now be described in more detail.

In the ion implantation method, an apparatus comprising an ion source for generating plasma from gas, an analysis magnet for performing mass separation in order to select desired ions among ions extracted from the ion source, an electrode for accelerating the desired ions, and a process chamber for implanting the accelerated desired ions into a silicon substrate, is used. In the ion implantation, in order to implant the impurity shallow, it is preferable to set extraction energy for extracting ions from the ion source and acceleration energy for accelerating small. However, when the extraction energy is set small, the number of ions to be extracted is decreased. In addition, when the acceleration energy is set small, while an ion beam is transported from the ion source to a wafer, a beam diameter is widened due to a repulsive force generated by charges between the ions. As a result, the ion beam may collide against the inner wall of a beam line, and a large number of ions may be lost. For this reason, throughput of an implantation processing will be lowered. For example, when B+ ions are implanted, if the acceleration energy becomes 2 keV or less, the throughput starts to be lowered, if the acceleration energy becomes 0.5 keV or less, the beam transportation itself become difficult. Further, even though the acceleration energy is lowered to 0.5 keV, the B ions may be implanted at a depth of approximately 20 nm. That is, in case of forming an extension electrode having a thinner thickness than the depth, productivity may be lowered drastically.

In contrast, in the plasma doping method, an apparatus comprising a plasma generation source for inducing plasma into a cylindrical vacuum chamber in which a silicon substrate can be disposed, a bias electrode on which the silicon substrate is disposed, and a bias power supply for adjusting a potential of the bias electrode, is used. The apparatus has the different configuration from the apparatus used in the ion implantation in point that the analysis magnet and the acceleration electrode are not provided. The bias electrode serving as a plasma source and a wafer holder is provided in the vacuum chamber. Then, the ions are accelerated and introduced by a potential to be generated between the plasma and the wafer. With this configuration, since low-energy plasma can be directly used, a large amount of low-energy ions can be irradiated onto the wafer, compared with the ion implantation. That is, a dose rate is considerably high. For this reason, in the low-energy B-ion implantation, high throughput can be kept.

By applying the plasma doping method, the inventors have developed a process technology for forming a source-to-drain extension electrode having a very shallow thickness and low resistance. The paper on this new process technology is adopted in VLSI Symposium that is the highest authority as one of International Conferences, in June 2004. This new process technology is known as a process technology that has particular effects ("Y. Sasaki, et al., Symp. on VLSI Tech. p 180 (2004)").

In this method, doping material gas which is introduced from a gas introduction port, such as $B_2H_6$, is plasmized by a plasma generation unit having a microwave waveguide and an electric magnet. Then, boron ions in plasma are supplied to a surface of a sample by a high-frequency power supply.

With the reduction in size and high integration of a semiconductor device, characteristics in an impurity doped region are very important. Among these characteristics, a dose (impurity doping amount) determines low resistance that is one of important elements in determining element characteristics. Accordingly, the control of the dose is very important.

If the plasma doping method is used, it can be seen that the source-to-drain extension electrode having a very shallow thickness and low resistance can be formed. However, a dose control method for controlling the element characteristics has not been developed yet. Up to now, a method for changing the dose by way of changing a plasma doping time has been tested, but this method does not obtain sufficient control precision, and as a result, it is unpractical.

In this situation, as a method which is capable of improving safety by diluting toxic $B_2H_6$ having a serious risk to the human body as large as possible, stably generating and keeping plasma without degrading doping efficiency, and easily performing the control of the dopant dose, the inventors has suggested the following method. In the method, $B_2H_6$ gas as a material containing an impurity to be doped is diluted with He gas having small ionization energy, then He plasma is generated earlier, and subsequently $B_2H_6$ is discharged (JP2004-179592) suggested that the concentration of $B_2H_6$ gas is preferably less than 0.05%.

When the concentration is low, for example, approximately 0.05%, although it is reported that the dose is easily controlled, changing the dose by varying the time while the gas concentration is kept constant is described. That is, when the $B_2H_6$ gas concentration is low, the change in the dose is small with respect to the variation in time, and thus the dose is easily controlled. Here, there is a progress in that the control precision of the dose is increased. However, this just improves the known method for changing the dose by changing a plasma doping time. Herein, there is no study for the relationship between the change in the dose and the gas concentration.

As described above, it is important to form the impurity doped region or control the dose. Of course, in-plane uniformity is also very important to form an element. In particular, while there is a recent progress in a large diameter of a wafer, it is very difficult to obtain a uniform dose in the surface.

SUMMARY OF THE INVENTION

The invention has been finalized in consideration of the above problems, and it is an object of the invention to provide a plasma doping method that can control a dose with high accuracy and can form a shallow impurity doped region.

It is another object of the invention to provide a plasma doping method that can realize high in-plane uniformity of a dose and can control the dose with high accuracy.

According to an aspect of the invention, there is provided a plasma doping method that supplies gas plasma containing impurity ions to a sample for a predetermined time with a predetermined concentration so as to form an impurity doped region in a surface of the sample. The plasma doping method includes a step of setting a doping time and a concentration of the gas plasma containing the impurity such that a dose is made uniform with no time dependency.

The inventors have repeated various experiments and have found that, if a bias is applied by irradiating $B_2H_6$/He plasma onto a silicon substrate, there is a time at which a dose of boron is made substantially uniform. Further, it can be seen that the saturation time is comparatively long and ease to stably use, compared with a time at which repeatability of an apparatus control can be secured. That is, if plasma irradiation starts, a dose is initially increased, but a time at which the dose is made substantially uniform without depending on a time variation is continued. In addition, if the time is further increased, the dose is decreased. The inventors have also found that the dose can be accurately controlled through a process window of the time at which the dose is made substantially uniform without depending on the time variation. The invention has been finalized focusing on the results.

According to another aspect of the invention, there is provided a plasma doping method that supplies gas plasma containing impurity ions onto a sample for a predetermined time with a predetermined concentration so as to form an impurity doped region in a surface of the sample. The plasma doping method includes a step of performing plasma doping within a time range in which a dose is made uniform with no time dependency in a state where a doping time and a concentration of the gas plasma containing the impurity ions are set such that a dose is made uniform with no time dependency.

According to this configuration, the concentration of the gas plasma containing the impurity ions is set in the time range in which the dose is made uniform with no time dependency. Accordingly, the dose can be accurately controlled. That is, even though the time is slightly changed, since the dose is not almost changed, the dose can be stably controlled. In contrast, in the known method that controls the dose according to the time, even though the time is slightly changed, the dose is drastically changed.

As a result of the repetitive experiment, when the $B_2H_6$/He concentration is changed with respect to a predetermined bias, it is possible to obtain a time range where the dose is not almost changed and is saturated. In addition, the inventors have found that, in the above time range, there is a time range where in-plane uniformity of sheet resistance (Rs) after annealing, that is, in-plane uniformity of the dose is very satisfactory. The invention has been finalized on the basis of the result. Accordingly, while plasma doping can be put to practical use, the problems relative to the control of the dose and in-plane uniformity can be solved by one effort.

In the plasma doping method according to another aspect of the invention, the doping time and the concentration of the gas plasma containing the impurity may be set such that doping of the impurity into the surface of the substrate and sputtering of the impurity from the surface of the substrate are saturated.

The inventors have repeated various experiments and have found that, if a bias is applied by irradiating the $B_2H_6$/He plasma onto the silicon substrate, there is a time at which doping of boron and sputtering of boron from the surface of the substrate by irradiation ions, radicals, gas in the plasma are saturated (balanced). Further, it can be seen that the saturation time is comparatively long and ease to stably use, compared with a time at which repeatability of an apparatus control can be secured.

In the plasma doping method according to another aspect of the invention, the doping time may be set to an extent that a dose in a portion where the dose in the surface of the substrate is small follows a dose of a portion where the dose is saturated.

According to this configuration, the concentration of the plasma containing the impurity ions is set in the time range in which the dose is made uniform with no time dependency. Further, the doping time is set to an extent that the dose in the portion where the dose in the surface of the substrate is small follows the dose of the portion where the dose is saturated. Accordingly, in order to increase in-plane uniformity, the dose can be accurately controlled. Actually, the saturation time range is measured at individual points in the surface, and a doping end point is set to the latest time among start points of the measured time range. Accordingly, the dose in the portion where the dose in the surface of the substrate is small follows the dose in the portion where the dose is saturated. Therefore, satisfactory in-plane uniformity can be obtained.

In the plasma doping method according to another aspect of the invention, the level of the uniform dose with no time dependency may be changed as the concentration of the gas plasma containing the impurity ions is changed.

With this configuration, the concentration of the gas plasma is set such that doping of the impurity ions into the surface of the substrate and sputtering from the surface of the substrate are saturated. Accordingly, the level of the uniform dose can be changed. Therefore, it is possible to form an impurity region in which an impurity concentration is stably controlled with high accuracy.

In the plasma doping method according to another aspect of the invention, the concentration of the gas plasma containing the impurity ions as a concentration and a pressure of gas containing impurity atoms and source power are changed.

With this configuration, the concentration of the gas plasma can be set in a desired range.

In particular, when the concentration of the gas containing the impurity atoms is changed, the concentration of the gas plasma containing the impurity ions can be simply and accurately changed. As a specific unit, the gas including the impurity atoms and a dilution gas may be mixed to be then used, and flow rates of the gases may be changed by mass flow controllers, such that mixture ratios of the gases are changed. Therefore, the concentration of the gas plasma containing the impurity ions can be simply and accurately changed.

In the plasma doping method according to another aspect of the invention, the concentration of the gas plasma, and the concentrations of ions, radicals, and gas of the gas plasma may be set such that doping of the impurity ions into the surface of the substrate and sputtering from the surface of the substrate are saturated as time increases.

With this configuration, the concentration of the gas plasma is set such that doping of the impurity ions into the surface of the substrate and sputtering from the surface of the substrate are saturated. Accordingly, the dose can be accurately controlled without depending on the time variation. Therefore, it is possible to form an impurity region in which the impurity concentration is stably controlled with high accuracy.

In the plasma doping method according to another aspect of the invention, the gas plasma containing the impurity ions may be mixture gas plasma of molecules ($B_nH_m$) having boron atoms and hydrogen atoms.

The inventors have repeated various experiments and have found that, when a concentration of $B_nH_m$ gas is being small, there is a region where the dose is made substantially uniform without depending on the time variation. Then, the concentration of the $B_nH_m$ gas is set such that doping of boron into the surface of the substrate and sputtering from the surface of the substrate are saturated. Accordingly, the dose can be accurately controlled without depending on the time variation. Therefore, it is possible to form the impurity region in which the dose of the impurity is stably controlled with high accuracy.

In the plasma doping method according to another aspect of the invention, the gas plasma containing the impurity ions may be mixture gas plasma of $B_2H_m$ and He.

The inventors have made various experiments and have found that, in a case where the mixture gas plasma of $B_2H_6$ and He is used, when the concentration of the $B_2H_6$ gas is being small, there is a region where the dose is made substantially uniform without depending on the time variation. The invention has been finalized focusing on the fact. Then, the concentration of the $B_2H_6$ gas is set such that doping of boron into the surface of the substrate and sputtering from the surface of the substrate are saturated. Accordingly, the dose can be accurately controlled without depending on the time variation. Therefore, it is possible to form the impurity region in which the impurity concentration is stably controlled with high accuracy.

In the plasma doping method according to another aspect of the invention, a concentration of $B_2H_6$ gas in the mixture gas plasma of $B_2H_6$ and He may be in a range of 0.01% to 1%. In case of less than 0.01%, when the concentration of $B_2H_6$ is changed, the change in the dose of boron to be saturated according to the time variation is excessively small. Accordingly, it is difficult to control the dose of boron to be saturated according to the time variation by the change in the concentration of $B_2H_6$. Further, in case of more than 1.0%, when the concentration of $B_2H_6$ is changed, the change in the dose of boron to be saturated according to the time variation is excessively large. Accordingly, in this case, controllability is degraded. For the same reason, the concentration of $B_2H_6$ is more preferably in a range of 0.025% to 0.6%.

From the experiment results, it has been found that, when the concentration of $B_2H_6$ of the mixture gas plasma of $B_2H_6$ and He is approximately 0.1%, there is a region where the dose is made substantially uniform without depending on the time variation.

In the plasma doping method according to another aspect of the invention, a bias voltage $V_{DC}$ may be 60 V or less.

From the experiment results, it has been found that, when the bias voltage $V_{DC}$ is 60 V or less, there is a region where the dose is made substantially uniform without depending on the time variation.

In the plasma doping method according to another aspect of the invention, source power may be approximately 1500 W.

From the experiment results, it has been found that, when source power is approximately 1500 W, there is a region where the dose is made substantially uniform without depending on the time variation.

In the plasma doping method according to another aspect of the invention, the gas plasma containing the impurity ions may be mixture gas plasma of $BF_3$ and He.

From the experiment results, like a case where the mixture gas plasma of $B_2H_6$ and He is used, in a case where the mixture gas plasma of $BF_3$ and He is used, it has also been found that, when the concentration of $BF_3$ gas is being small, there is a region where the dose is made substantially uniform without depending on the time variation. Therefore, it is possible to form the impurity region in which the dose of the impurity is stably controlled with high accuracy.

In the plasma doping method according to another aspect of the invention, the sample may be a silicon substrate.

From various experiment results, in a case where the mixture gas plasma of $B_2H_6$ and He is used upon doping into the silicon substrate, it has been found that, when the concentration of $B_2H_6$ gas is being small, there is a region where the dose is made substantially uniform without depending on the time variation. When the mixture gas plasma of $B_nH_m$ and He is used, the same effects can be obtained.

As such, in the invention, the doping time and the concentration of the gas plasma containing boron is set such that doping of boron into the surface of the substrate and sputtering from the surface of the substrate.

In the plasma doping method according to another aspect of the invention, plasma doping may be performed in the time region where the dose is made uniform with no time dependency. Accordingly, it is possible to form the impurity region in which the dose of the impurity is stably controlled with high accuracy.

With this configuration, the dose can be accurately controlled through a process window of the time at which the dose is made uniform without depending on the time variance.

Preferably, the activation step may include a step of irradiating laser light.

Since laser light has a high energy density, high-efficient activation can be performed.

The activation step may include a step of irradiating radiation light of a flash lamp.

The flash lamp is cheap, and thus low cost can be realized.

The activation step may include a step of irradiating radiation light of a tungsten halogen lamp.

All the heat treatments using the tungsten halogen lamp have been put to practical use, and thus the activation can be performed with good reliability.

In the plasma doping method according to another aspect of the invention, the plasma doping may be performed in a state where a temperature of an inner wall of a reaction chamber coming into contact with the plasma is made substantially uniform.

In the plasma doping method according to another aspect of the invention, plasma doping may be performed in a state where the inner wall of the reaction chamber coming into contact with the plasma is heated.

In the plasma doping method according to another aspect of the invention, plasma doping may be performed in a state where the inner wall of the reaction chamber coming into contact with the plasma is cooled.

In the plasma doping method according to another aspect of the invention, the concentration of the gas containing the impurity atoms may be lowered during a treatment.

As described above, according to the plasma doping method of the invention, the impurity doping amount can be accurately controlled. Further, it is possible to form the impurity region in which the dose is stably controlled with high accuracy.

Further, it is possible to form the impurity region having excellent in-plane uniformity.

DESCRIPTION OF THE PREFERRED EMBODIMENTS

Hereinafter, embodiments of the invention will be described with reference to the drawings.

First Embodiment

Hereinafter, a first embodiment of the invention will be described in detail with reference to the drawings.

Figure 1:
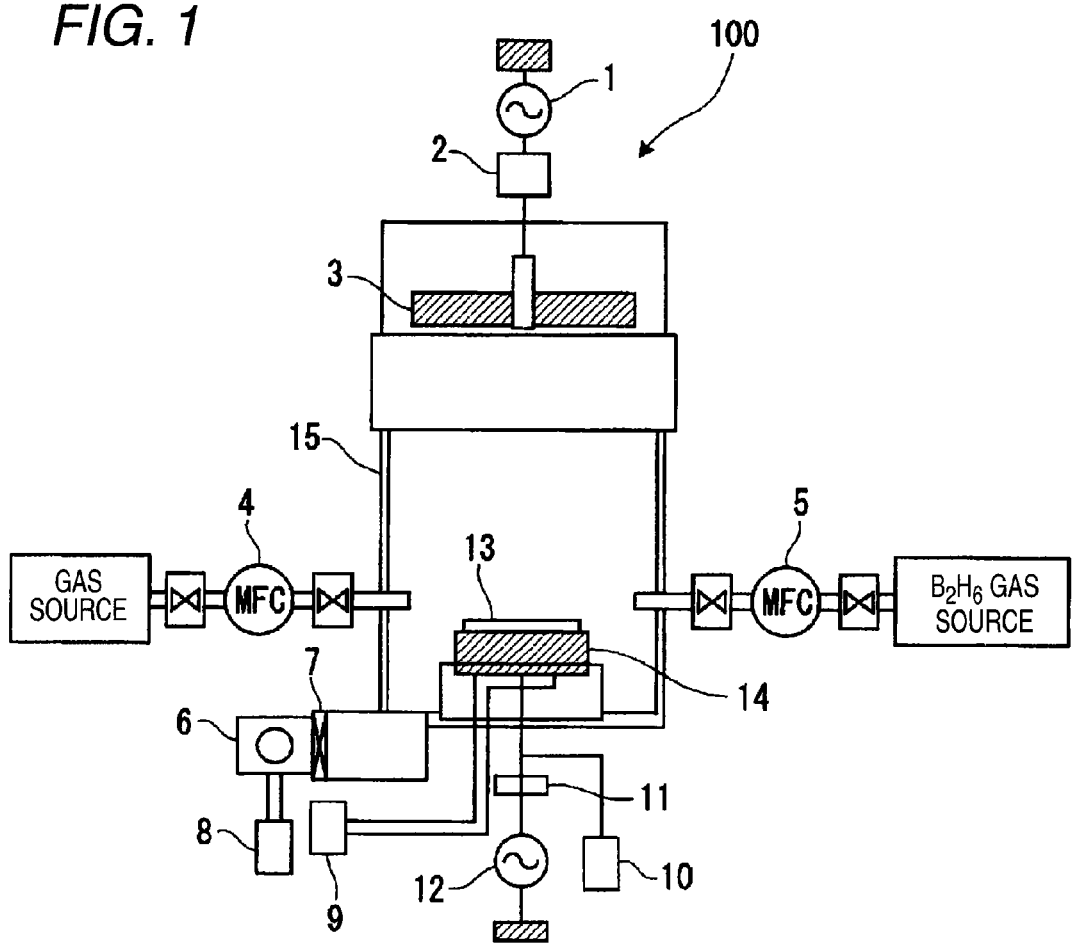
FIG. 1 is a cross-sectional view of an impurity doping apparatus that is used in a first embodiment of the invention.

An apparatus shown in FIG. 1 is referred to as a plasma doping apparatus A (PD apparatus A).

In this embodiment, upon doping of an impurity, a concentration of gas plasma containing impurity ions to be doped is set such that doping of the impurity ions and sputtering of a surface of a silicon substrate (silicon wafer) are saturated. According to this, a dose can be accurately controlled without depending on a time variation. Therefore, it is possible to form an impurity region in which an impurity concentration is stably controlled with high accuracy. Further, it is possible to form an impurity region having excellent in-plane uniformity.

Here, the concentration of the gas plasma is set such that doping of the impurity ions and sputtering of the surface of the substrate are saturated. According to this, the dose can be accurately controlled without depending on the time variation. Therefore, it is possible to form an impurity region in which a dose of the impurity is stably controlled with high accuracy.

This may be expressed as follows. Plasma doping is performed in a time range where the dose is made uniform, irrespective of the time variation, when doping of the impurity ions and sputtering of the surface of the substrate are saturated.

In order to obtain in-plane uniformity, a time range to be saturated is measured at individual points in the surface, and a doping end point is set to the latest time among start points of the measured time range. Accordingly, a dose in a portion where the dose in the surface of the substrate is small follows a dose in a portion where the dose is saturated, thereby obtaining in-plane uniformity.

FIG. 1 is a cross-sectional view of an impurity doping apparatus used in a first embodiment of the invention.

The impurity doping apparatus, that is, a process chamber includes a reaction chamber 15, a turbo molecular pump 6 serving as an exhaust device for exhausting the reaction chamber 15, a pressure regulating valve 7 serving as a pressure control device that controls a pressure in the reaction chamber 15, a coil and antenna 3 serving as a plasma source provided in the vicinity of a dielectric window facing a lower electrode 14, a high-frequency power supply 12 for supplying high-frequency power of 13.56 MHz to the coil or antenna 3, and a high-frequency power supply 1 serving as a voltage source supplied a voltage to the lower electrode 14. A substrate to be processed (substrate) 13 is placed on the lower electrode 14 serving as a sample table, and plasma irradiation is performed onto the substrate 13.

Here, a high frequency is supplied from the coil and antenna 3 through the high-frequency power supply 1 for generating plasma and the matching box 2 for adjusting the discharge. Required gas is supplied through the mass flow controllers (MFC) 4 and 5. A degree of vacuum in the reaction chamber 15 is controlled by the mass flow controllers 4 and 5, the turbo molecular pump 6, the pressure regulating valve 7, and the dry pump 8. Power is supplied to the reaction chamber 15 from the high-frequency power supply 12 through the matching box 11. The substrate 13 to be processed that is provided in the reaction chamber 15 is placed on the sample table 14, and then the power is supplied.

Next, a plasma doping process will be described.

A predetermined gas is introduced from the gas supply device into the reaction chamber 15 of the process chamber through the mass flow controllers 4 and 5, while gas exhaust is performed by the turbo molecular pump 6 as an exhaust device. Further, the reaction chamber 15 is kept at a predetermined pressure by the pressure regulating valve 7 as a pressure control device. Then, high-frequency power of 13.56 MHz is supplied from the high-frequency power supply 1 to the coil 3 as a plasma source, such that inductively coupled plasma is generated in the reaction chamber 15. In this state, high-frequency power is supplied by the high-frequency power supply 12, and then the potential of the lower electrode 14 can be controlled such that the silicon substrate (the substrate to be processed) 13 as a sample has a negative potential with respect to plasma.

Although an inductively coupled plasma is generated using the coil in this embodiment, an antenna may be used instead of the coil. Alternatively, helicon plasma, surface wave plasma, electronic cyclotron resonance plasma, or the like may be generated.

After the silicon substrate 13 is placed on the sample table 14 as the lower electrode, while the reaction chamber 15 is exhausted, helium gas is supplied into the reaction chamber 15 by the mass flow controller 4 and diborane ($B_2H_6$) gas as doping material gas is supplied into the reaction chamber 15 by the mass flow controller 5. At this time, the pressure regulating valve 7 is controlled such that the pressure of the reaction chamber 15 is kept at 0.9 Pa. Next, high-frequency power 1500 W is supplied to the coil 3 as a plasma source so as to generate plasma in the reaction chamber 15. Further, high-frequency power 200 W is supplied to the lower electrode 14 such that boron is implanted in the vicinity of the surface of the silicon substrate 13. Here, plasma exposed to the silicon substrate 13 is mixture gas plasma of $B_2H_6$ and He ($B_2H_6$/He plasma). Moreover, the mixture ratio of $B_2H_6$ and He can be changed by changing a ratio of flow rates of He gas and $B_2H_6$ gas flowing in the mass flow controllers 4 and 5.

If a bias is applied by irradiating the mixture gas plasma of $B_2H_6$ and He ($B_2H_6$/He plasma) onto the silicon substrate, there is a time when doping and sputtering of boron are saturated (balanced). Further, in this embodiment, it can be seen that the saturation time is comparatively long and ease to stably use. That is, if plasma irradiation starts, a dose is initially increased, but a time at which the dose is made substantially uniform without depending on a time variation is continued. In addition, if the time is further increased, the dose is decreased. Accordingly, the dose can be accurately controlled through a process window of the time when the dose is made substantially uniform without depending on the time variation. Further, in-plane uniformity can be obtained by previously measuring, in the surface of the silicon substrate, the time when the dose is made uniform and setting the doping time according to the latest start time.

Second Embodiment

Hereinafter, a second embodiment of the invention will be described with reference to FIG. 2.

Figure 2:
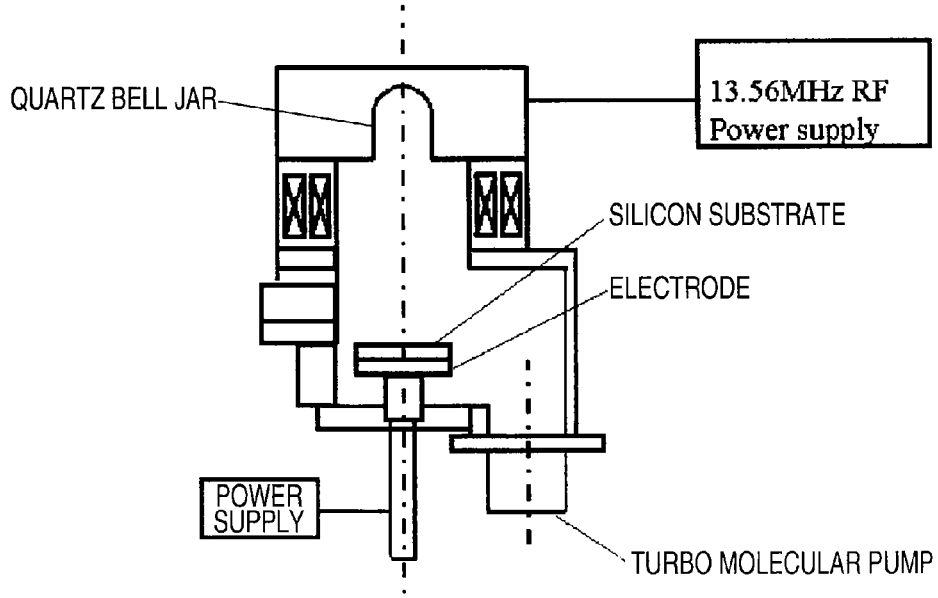
FIG. 2 is a cross-sectional view of an impurity doping apparatus that is used in a second embodiment of the invention.

An apparatus shown in FIG. 2 is referred to as a plasma doping apparatus B (PD apparatus B).

FIG. 2 is a schematic plan view of an impurity doping apparatus used in the second embodiment of the invention. In FIG. 2, the impurity doping apparatus uses a helicon plasma device, and thus, in this device, $B_2H_6$/He gas and He gas are supplied through mass flow controllers 24 and 25.

Here, the impurity is also doped into a silicon substrate (sample) 33 placed on a sample table 34 in a reaction chamber 35. High frequency is supplied to a coil 23 by a high-frequency power supply 21, and then the $B_2H_6$/He gas and He gas to be supplied through the mass flow controllers 24 and 25 are plasmized.

In this apparatus, the mass flow controllers 24 and 25 are controlled with high accuracy, and the mixture ratio of $B_2H_6$/He is controlled. Accordingly, the concentration of the gas plasma can be controlled such that the dose is mad uniform with no time dependency.

EXAMPLE 1

Plasma doping is performed on a 200 mm substrate using the PD apparatus B described in the second embodiment with reference to FIG. 2 while the dose of boron and the plasma doping time are changed.

Figure 3:
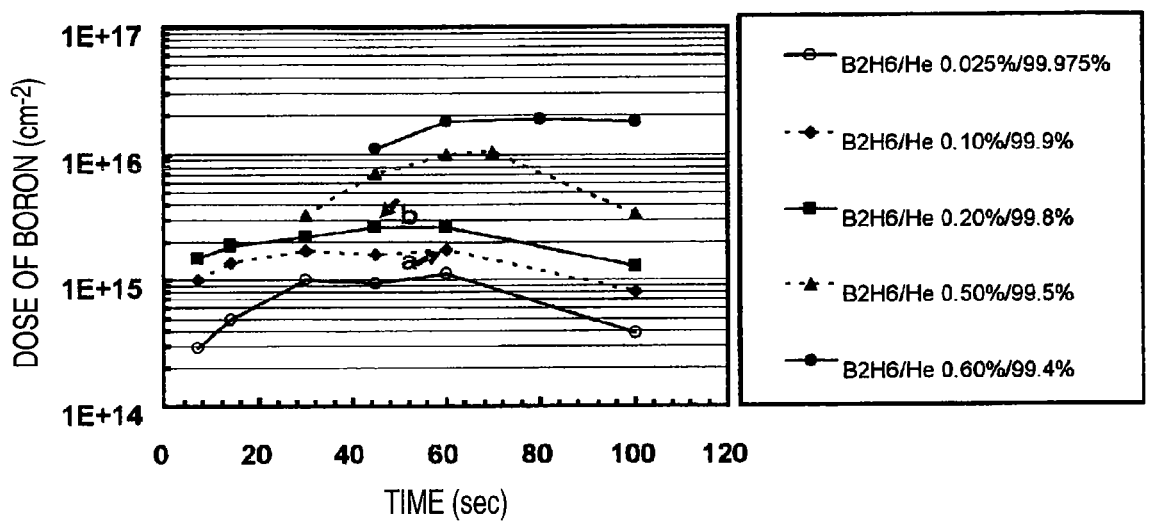
FIG. 3 is a diagram showing the relationship between a dose and a time in a method according to Example 1 of the invention.

FIG. 3 shows the measurement result of the relationship between the dose of boron and the plasma doping time at this time. The vertical axis represents the dose and the horizontal axis represents the plasma doping time.

If a bias is applied by irradiating the mixture gas plasma of $B_2H_6$ and He ($B_2H_6$/He plasma) onto the silicon substrate, there is a time when doping and sputtering of boron are saturated (balanced). Further, in this embodiment, it can be seen that the saturation time is comparatively long and ease to stably use. That is, if plasma irradiation starts, a dose is initially increased, but a time at which the dose is made substantially uniform without depending on a time variation is continued. In addition, if the time is further increased, the dose is decreased. Accordingly, the dose can be accurately controlled through a process window of the time when the dose is made substantially uniform without depending on the time variation. Further, in-plane uniformity can be obtained.

With this phenomenon, for example, it is verified that the dose of boron can be set to $2.62E15$ $cm^{-2}$ at accuracy within $1\sigma=1\%$. If plasma doping is performed with the $B_2H_6$/He gas concentrations 0.2%/99.8% at $V_{DC}$ 60 V, source power 1500 W, and a pressure 0.9 Pa, a change in the dose from 45 seconds to 60 seconds is negligibly $0.01E15$ $cm^{-2}$ since the dose at 45 seconds is $2.62E15$ $cm^{-2}$ and the dose at 60 seconds is $2.63E15$ $cm^2$/as indicated by a curve b of FIG. 3. At this time, the dose is increased in a small increment per unit time. The rate is very slow, that is, $(2.63E15-2.62E15)/(60-45)=6.7E11$ $cm^{-2}$/seconds. That is, the dose is stable with respect to the time variation.

A difference ($\pm 3\sigma$) between the maximum and the minimum of the tolerable dose such that the condition $1\sigma=1\%$ is established when $2.62E15$ $cm^{-2}$ is sought is $2.52-2.68E15$ $cm^{-2}$, that is, approximately $1.5E154$ $cm^{-2}$. During the doping time between 45 seconds to 60 seconds, the dose is changed only at a slow rate of $6.7E11$ $cm^{-2}$/sec. Accordingly, it is expected that the dose control of $1\sigma=1\%$ aimed at $2.62E15$ $cm^{-2}$ can be performed. This is because the control of the doping time to be determined by the apparatus is in an order of 100 milliseconds and the doping time is shifted by 1 second at most.

Here, the dose is estimated from sheet resistance after annealing is performed at 1100° C. and for 3 minutes, and a difference between sheet resistances of samples during the doping time between 45 seconds to 60 seconds is negligibly 107.4 to 107.0 ohm/sq and 0.4 ohm/sq. The small change in the dose for a long time of 15 seconds is a remarkable discovery. Though described above, in view of the apparatus control, a time shift when plasma doping is repeatedly performed for 50 seconds is hundreds microseconds at most. Accordingly, since it is sufficient to pay attention to a shift of approximately 50 seconds±0.5 seconds, a dose control method is very stable and has high controllability.

From FIG. 3, it can be seen that, when the $B_2H_6$/He gas concentration is 0.025%/99.975%, there is a time range in which doping and sputtering of boron are balanced in the vicinity of 60 seconds. When the $B_2H_6$/He gas concentration is 0.1%/99.9%, the time range exists in the vicinity of 60 seconds. When the $B_2H_6$/He gas concentration is 0.2%/

99.8%, the time range exists in the vicinity of 45 to 60 seconds. When the $B_2H_6$/He gas concentration is 0.5%/99.56, the time range exists in the vicinity of 60 to 70 seconds. In addition, when the $B_2H_6$/He gas concentration is 0.6%/99.5%, the time range exists in the vicinity of 60 to 100 seconds. In these vicinities, in view of the apparatus control, a time-variant change in the dose is very small, and the dose can be controlled with high accuracy. This can be explained by the same logic as a case where the $B_2H_6$/He gas concentration is 0.2%/99.8%.

Figure 4:
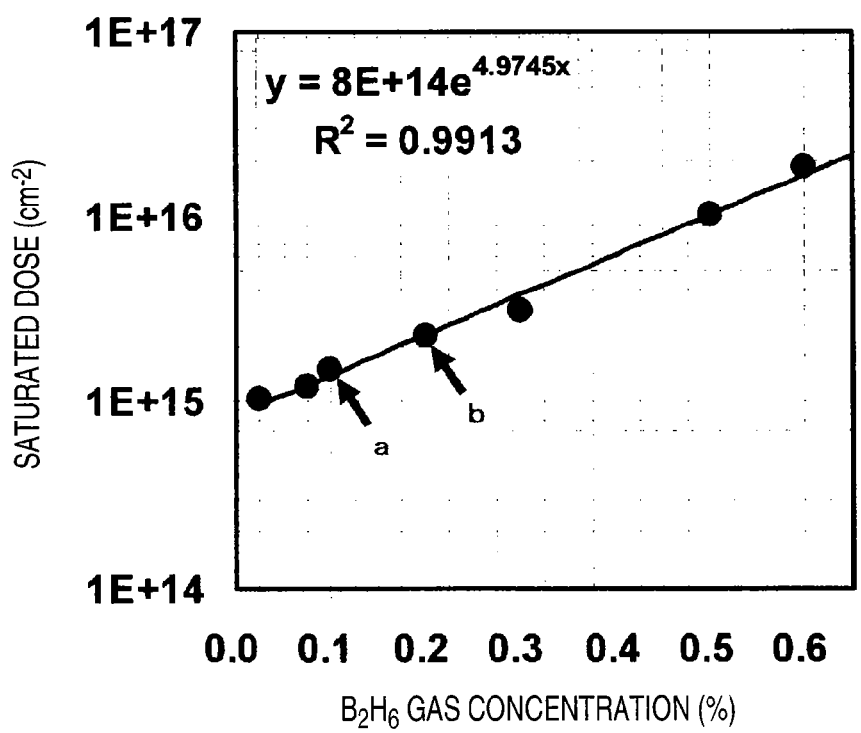
FIG. 4 is a diagram showing the relationship between a dose and a gas concentration in the method according to Example 1 of the invention.

FIG. 4 shows, with respect to the time variation from the experiment result of FIG. 3, the arrangement result of the relationship between the dose B and the $B_2H_6$/He gas concentration when the time variation is saturated. The vertical axis represents the saturated dose and the horizontal axis represents the $B_2H_6$/He gas concentration. As a result, the $B_2H_6$/He gas concentration and the saturated dose have a one-to-one relationship. From the above description, the following can be verified. First, when the $B_2H_6$/He gas concentration is changed, the level of the dose in which the change in the dose with respect to the time variation is made substantially uniform can be changed. Further, the $B_2H_6$ gas concentration is adjusted such that the level of the dose in which the change in the dose with respect to the time variation is made substantially uniform becomes a desired dose. In addition, the plasma doping time is adjusted to the time region where the change in the dose with respect to the time variation is made substantially uniform, and thus the dose can be accurately controlled to a desired value.

In contrast, only by adjusting the $B_2H_6$ gas concentration, stability against the time shift is lacking. Further, in a region other than the time region where the change in the dose with the time variation is made substantially uniform, only by adjusting the plasma doping time, stability against the time shift is lacking. In addition, the time region where the change in the dose against the time variation is made substantially uniform varies by the $B_2H_6$ gas concentration. Accordingly, it is necessary to adjust the time region according to each $B_2H_6$ gas concentration. When this adjustment is performed, while the dose can be accurately adjusted at a certain $B_2H_6$ gas concentration, stability against the time shift may be lacking at a different $B_2H_6$ gas concentration.

Figure 5:
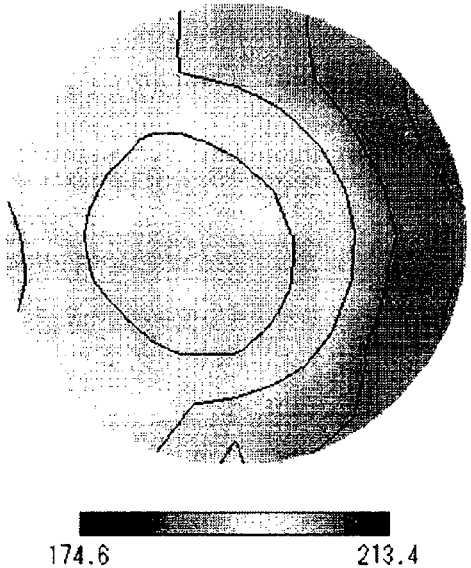
FIG. 5 is a diagram showing an Rs distribution of a sample obtained in the method according to Example 1 of the invention.
Figure 6:
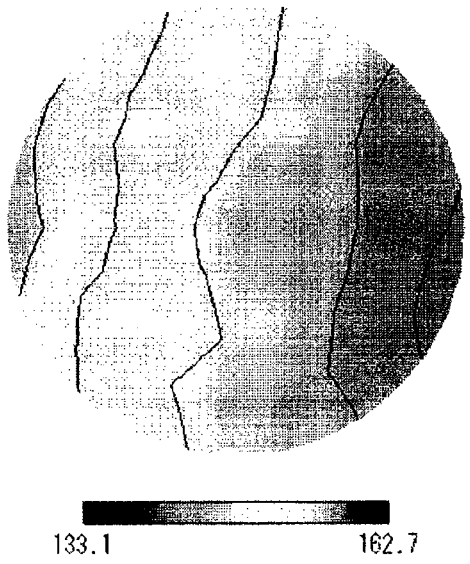
FIG. 6 is a diagram showing an Rs distribution of a sample obtained in the method according to Example 1 of the invention.

FIGS. 5 and 6 show the results of annealing on the substrate at 1075° C. and for 20 seconds after plasma doping prepared using the dose control method. Sheet resistance is measured at 81 places in the surface excluding an end 5 mm of the 200 mm substrate. This has a feature in that the plasma doping time at which the dose is made uniform with respect to the time variation and the $B_2H_6$/He gas concentration are used. Here, a simple description will be given with reference to FIGS. 3 and 4. If the $B_2H_6$/He gas concentration is appropriately set with respect to a predetermined bias, as shown in FIG. 3, it is possible to form a time range where the B dose is not almost changed and saturated with respect to the change in the plasma doping time. The B dose to be saturated can be changed when the $B_2H_6$/He gas concentration is changed, as shown in FIG. 4. That is, the dose can be controlled. Here, the plasma doping conditions used in FIGS. 5 and 6 are the plasma doping conditions indicated by arrows a and b in FIGS. 3 and 8. Symbol a represents FIG. 5 and symbol b represents FIG. 6.

FIG. 5 shows Rs uniformity when the B dose is adjusted to 1.63E15 cm$^{-2}$ by setting the $B_2H_6$/He gas concentration 0.1%/99.9% and the plasma doping time 60 seconds using the dose control method. The average of Rs is 194.0 ohm/sq, and uniformity is 2.25% at 1σ. In case of a sample that is prepared at a time at which the dose is not saturated, uniformity is approximately 5% to 10% at 1σ, and thus a uniform layer is not formed. This is one of effects according to the selection of the saturation time of the dose.

FIG. 6 is a diagram showing the measurement results of the relationship between the gas concentration and the time when the B dose is adjusted to 2.62E15 cm$^{-2}$ by setting the $B_2H_6$/He gas concentration 0.2%/99.8% and the plasma doping time 45 seconds using the dose control method. The average of Rs is 147.9 ohm/sq, and uniformity is 2.42% at 1σ. As such, in case of the dose different from FIG. 5, good uniformity of 2.5% or less can be reproduced.

In general, as for uniformity, as the value of 1σ is smaller, a degree of technical difficulty in improving uniformity is rapidly increased. That is, of a degree of difficulty in improving uniformity from 10% to 5% and a degree of difficulty in improving uniformity from 5% to 2.5%, the latter case is still more difficult. As for uniformity of 5% or more when the invention is not applied, with the application of the invention, uniformity of 2.5% or less is easily obtained. This represents validity of the invention.

EXAMPLE 2

Next, as Example 2 of the invention, plasma doping is performed on a 300 mm substrate using the PD apparatus A shown in FIG. 1 while the dose of boron and the plasma doping time are changed.

Figure 7:
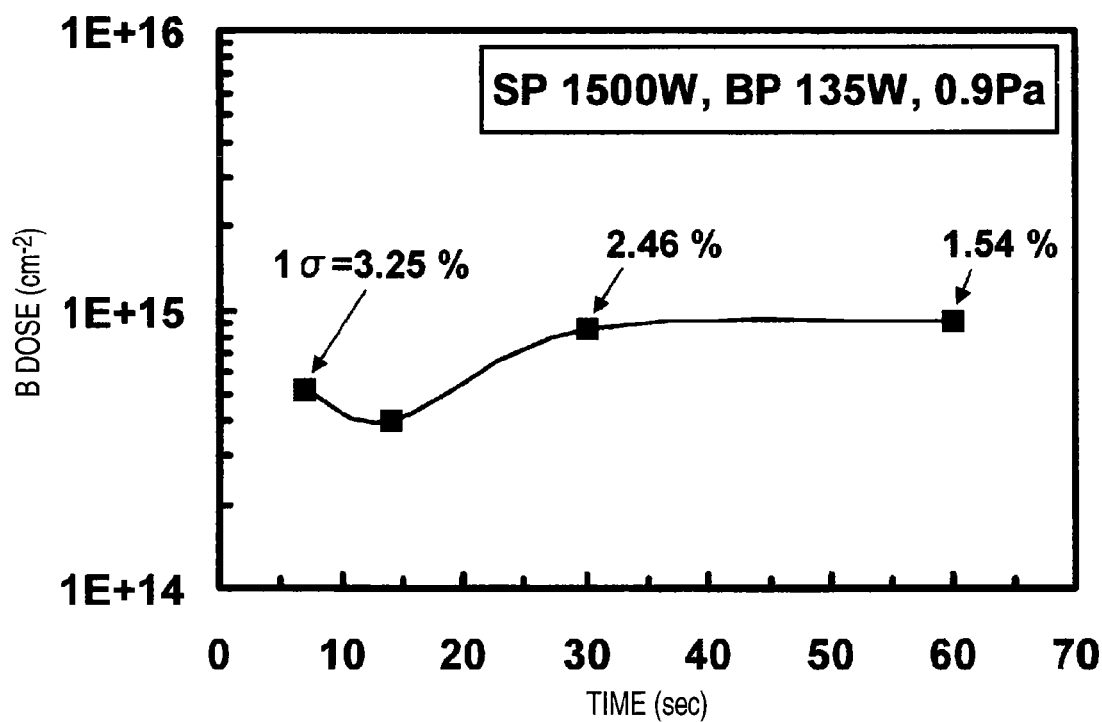
FIG. 7 is a diagram showing the relationship between a dose and a time in a method according to Example 2 of the invention.

FIG. 7 shows the measurement results of the plasma doping time, and the dose of boron and in-plane uniformity. It can be seen that the dose of boron starts to be saturated with respect to the time variation at approximately 30 seconds. Further, the dose of boron and in-plane uniformity exhibit good values when 30 seconds lapse, that is, when the plasma doping time reaches 60 seconds.

Figure 8:
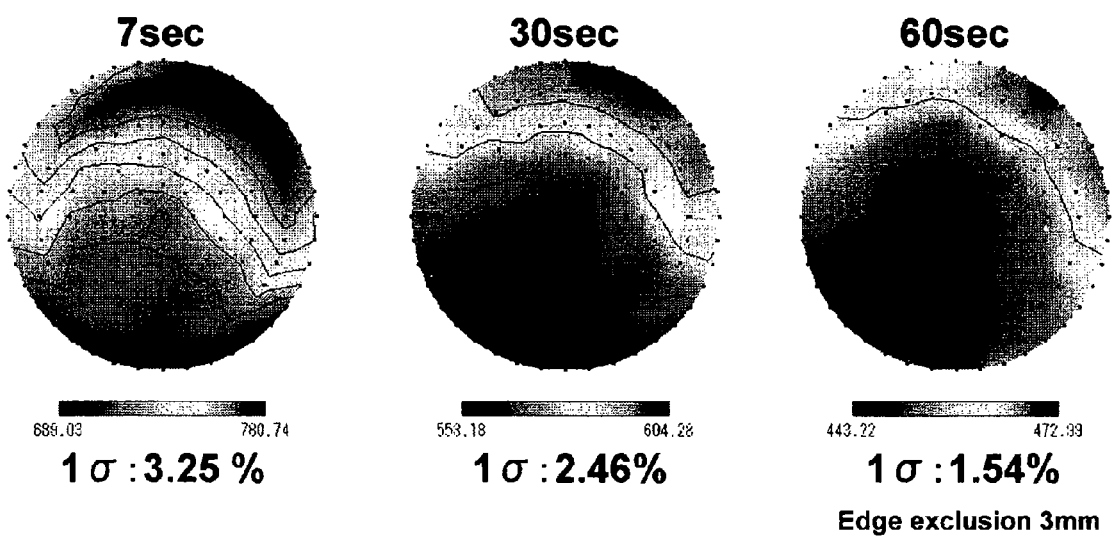
FIG. 8 is a diagram showing in-plane uniformity of a dose in the method according to Example 2 of the invention.
Figure 9:
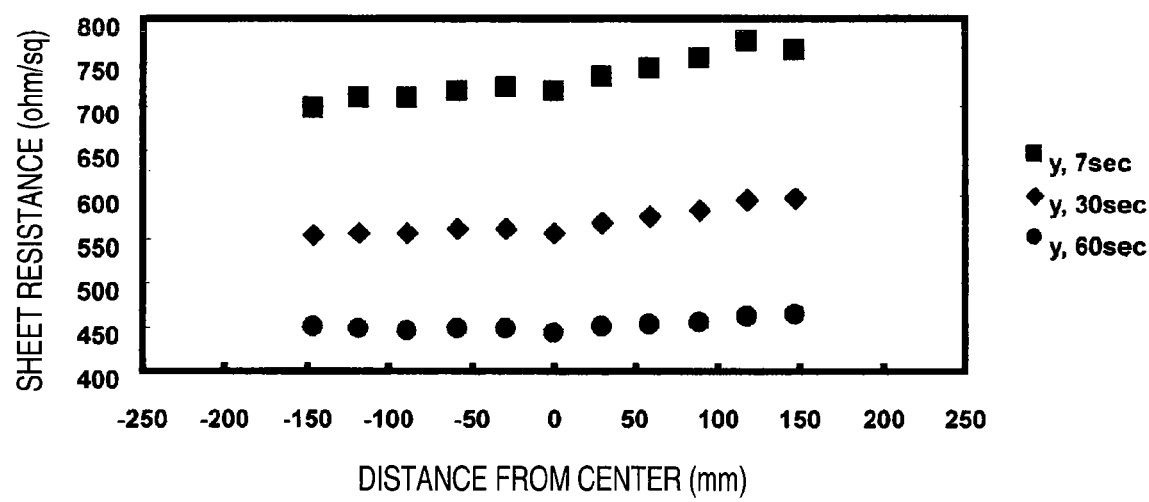
FIG. 9 is a diagram showing a sheet resistance distribution on a Y axis in the method according to Example 2 of the invention.

FIG. 8 shows an in-plane distribution of sheet resistance after boron is doped into the 300 mm substrate shown in FIG. 7 by plasma doping and then annealing is performed at 1075° C. and for 20 seconds. Sheet resistance is measured at 121 places in the surface excluding an end 3 mm of the 300 mm substrate. FIG. 9 shows the distribution of sheet resistance on the vertical axis passing through the center of the substrate among the in-plane distributions in FIG. 8. Further, FIG. 10 corresponds to FIG. 9 and is a table showing normalized values of sheet resistance obtained by dividing sheet resistance by an average value in each surface of the substrate.

As such, the dose is not changed according to the change in the plasma doping time, and after a while, in-plane uniformity is also improved. This may be because the dose is not changed with respect to the change in the plasma doping time, and after a while, a dose in a portion where the dose in the surface of the substrate is small follows a dose in a portion where the dose is saturated.

Meanwhile, if a time immediately after the dose is not change with respect to the change in the plasma doping time is set to the plasma doping time, the dose in the portion where the dose in the surface of the substrate is small does not follow the dose in a portion where the dose is saturated. In this case, in-plane uniformity is not sufficient.

That is, even though the dose control is sufficient, in order to secure in-plane uniformity, it is necessary to more optimally set the plasma doping time.

Figure 10:
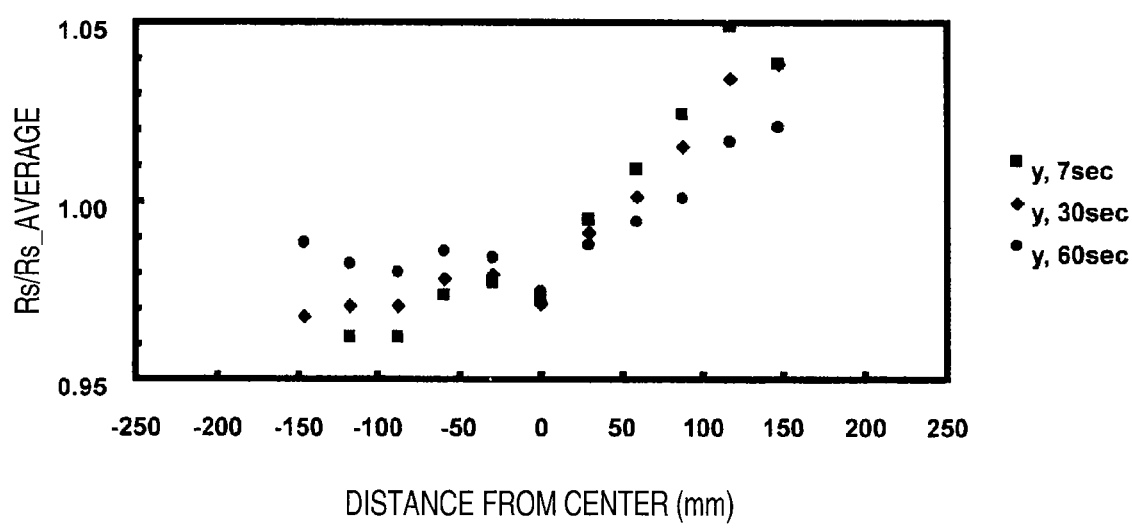
FIG. 10 is a diagram showing a distribution of a sheet resistance standard value of a Y axis in the method according to Example 2 of the invention.

Next, a mechanism of the invention will be described with reference to FIGS. 9 and 10. In FIGS. 9 and 10, sheet resistances after 7 seconds (7 sec), 30 seconds (30 sec), and 60 seconds (60 sec) are shown. In a portion (a portion from 150 mm to 0 mm on a horizontal axis of FIGS. 9 and 10)

where a large amount of boron is initially doped, the dose is comparatively rapidly saturated as time lapses. To the contrary, in a portion (a portion from 75 mm to 150 mm on a horizontal axis of FIGS. 9 and 10) where boron is not doped so much at the beginning of plasma doping, it takes comparatively much time until the dose is saturated.

However, if the does starts to be saturated and time lapses, in the portion where a large amount of boron is initially doped, the dose is saturated and boron is not doped any more. Meanwhile, in the portion where boron is not initially doped so much, the dose reaches the saturation. Accordingly the difference becomes smaller. For this reason, in FIGS. 9 and 10, when doping is performed for 60 seconds, a variation width of sheet resistance on the vertical axis is small. Accordingly, in-plane uniformity of sheet resistance can be improved. The method according to the invention is a unit effective to secure in-plane uniformity upon plasma doping. Simultaneously, as described above, the dose can be controlled.

Moreover, under the annealing condition at 1075° C. and for 20 seconds used in Examples 1 and 2, the distribution of sheet resistance may be regarded as the distribution of the dose. This is because the dose and sheet resistance has a one-to-one relationship. Under the annealing condition at high temperature and for a comparatively long time, it can be estimated that the impurity is almost electrically activated. This is considered as a reason for the one-to-one relationship.

Next, an activation step will be described. This is common to, not depend on, the PD apparatus. Upon annealing, the silicon substrate supplied with the impurity ions is placed on the sample table of an annealing device. Then, laser light that is emitted from an infrared laser and reflected by a mirror is irradiated onto the surface of the silicon substrate, such that the surface of the silicon substrate is heated and activated.

Moreover, in the activation step, as an activation processing chamber, a flash lamp processing chamber may be used. The flash chamber processing chamber includes a chamber, a sample table, a window, and a flash lamp. The silicon substrate supplied with the impurity ions is placed on the sample table, and reflected light from the flash lamp is irradiated onto the surface of the silicon substrate, such that the surface of the silicon substrate is heated and activated.

Moreover, in the above embodiment, in the activation step, the flash lamp processing chamber is used as the activation processing chamber. However, a tungsten halogen lamp that is used in a semiconductor factory for mass production at present may be used.

In the above-described embodiments of the invention, among the application scopes of the invention, only some of various variations of the configuration, shape, and arrangement of the processing chamber are illustrated. Of course, various variations, which still fall within the scope of the invention, other than illustrations can be considered.

Further, although a case where the sample is a semiconductor substrate formed of a silicon substrate has been described, the invention can be applied when various different samples are processed. For example, the invention can be effectively applied to a stained silicon substrate and an SOI substrate. This is because the substrates are the same as the silicon substrate in view of only the surface shape as viewed from the plasma. In addition, the invention can be effectively applied to a Fin FET. In case of Fin FET, in general, the structure is in an order of 1 μm or less. A sheath width of the plasma is in an order of 1 mm or more. Accordingly, when only the surface shape as viewed from the plasma is considered, the structure of Fin FET is negligibly small. This is the same as the silicon substrate.

Further, although a case where the impurity is boron has been described, when the sample is the semiconductor substrate formed of silicon, in particular, when the impurity is arsine, phosphorous, boron, aluminum, or antimony, the invention can be effectively applied. This is because a shallow junction can be formed in a transistor portion.

Further, the invention can be effectively applied when the concentration of gas containing an impurity is low. In particular, the invention can be effectively applied to a plasma doping method in which the dose needs to be controlled with high accuracy.

Further, a case where, in the plasma doping step, the gas supplied to the reaction chamber is gas containing a doping material has been described. However, the invention can be applied to a case where the gas to be supplied to the reaction chamber does not include the doping material, and the doping material is generated from a solid impurity. That is, the invention can be effectively applied to a case where a solid containing impurity atoms is placed in the reaction chamber, plasma, such as He or the like, is excited, and the impurity atoms are plasmized and doped by plasma doping.

Further, when the plasma doping is performed, it is preferable that the treatment be performed in a state where a temperature of an inner wall of the reaction chamber coming into contact with the plasma is kept substantially constant. This is because, if the temperature of the inner wall of the reaction chamber is changed during the treatment, an attachment possibility of the impurity ions at the temperature of the inner wall is changed, and the number of impurity ions to be emitted from a thin film containing the impurity ions stuck to the inner wall into the plasma is changed, which cause the change in the dose per unit time. As a method of keeping the temperature of the inner wall of the reaction chamber, a method of heating the inner wall by a heater or a method of cooling the inner wall through the circulation of a refrigerant can be appropriately selected.

Further, when the concentration of gas containing the impurity in the reaction chamber is adjusted, a method that adjusts the gas supply amount so as to directly adjusts the concentration itself, a method that lowers the temperature of the inner wall of the reaction chamber and educes a predetermined impurity so as to lower the concentration of the impurity, a method that lowers the temperature of the inner wall of the reaction chamber and suppresses the eduction of a predetermined impurity so as to keep the concentration of the impurity, or a method that adjusts the temperature of the inner wall of the reaction chamber so as to adjust the dose can be used. Further, with a feedback function, the concentration control can be performed while the temperature control of the inner wall of the reaction chamber.

Further, when plasma doping is performed, the concentration of gas containing the impurity ions may be lowered during the treatment. An appropriate method for this case will be described.

First, in a state where the concentration of gas containing the impurity atoms is high, plasma doping is performed. At this time, the dose per unit time at the beginning of the treatment is set high.

Next, in a state where the concentration of gas containing the impurity atoms is low, plasma doping is performed. Then, the plasma doping treatment is stopped in a time range in which the dose is mad uniform with no time dependency. In such a manner, compared with a case where the treatment is performed in a state where the concentration of gas containing the impurity ions from the beginning, the total processing time can be reduced.

In this case, a method that lowers the concentration of gas by raising the temperature of the inner wall of the reaction chamber, increasing the concentration of gas including the impurity to the maximum, then lowering the temperature of the inner wall of the reaction chamber, and subsequently promoting the eduction of the impurity to the inner wall may be effectively used.

According to the plasma doping method, it is possible to realize a plasma doping method that can control an impurity doping amount precisely and economically and can form a shallow impurity diffusion region. In addition, the plasma doping method of the invention can be applied to the use, such as an impurity doping process of a semiconductor or manufacturing of a thin film transistor used in liquid crystal or the like.

What is claimed is:

1. A plasma doping method for irradiating plasma of gas containing an impurity onto a substrate so as to form an impurity doped region in a surface of the substrate, comprising the steps of:
    determining a plasma doping time range in which a dose of the impurity to be doped into a first substrate is made substantially uniform irrespective of variation in plasma doping time; and
    after the step of determining the plasma doping time range, plasma-doping the impurity into a second substrate using a predetermined plasma doping time within the plasma doping time range.

2. The plasma doping method according to claim 1, further comprising a step of:
    before the step of plasma-doping, determining a concentration of the gas containing the impurity used in the step of plasma-doping, by calculating relationships between a concentration of the gas containing the impurity and the uniform dose which is made substantially uniform, irrespective of variation in plasma doping time, with respect to a plurality of concentrations.

3. The plasma doping method according to claim 1, wherein the step of determining the plasma doping time range comprises a step of respectively calculating plasma doping time ranges, in which the dose of the impurity to be doped into the first substrate is made substantially uniform irrespective of variation in plasma doping time, at a plurality of portions in the surface of the first substrate; and
    the predetermined plasma doping time is determined based on a latest plasma doping time range among the respective plasma doping time ranges.

4. The plasma doping method according to claim 1, wherein a diameter of the first substrate and second substrate is 200 mm or more; and
    the predetermined plasma doping time is determined such that uniformity represented by 1 $\sigma$ of the dose of the impurity in the surface of the first substrate and second substrate becomes 2.5% or less.

5. The plasma doping method according to claim 4, wherein the diameter of the first substrate and second substrate is 300 mm or more.

6. The plasma doping method according to claim 1, wherein the plasma of the gas containing the impurity is a mixture gas plasma of molecules ($B_nH_m$) having boron atoms and hydrogen atoms.

7. The plasma doping method according to claim 1, wherein the plasma of the gas containing the impurity is a mixture gas plasma of $B_2H_6$ and helium.

8. The plasma doping method according to claim 7, wherein a $B_2H_6$ gas concentration in the mixture gas plasma of $B_2H_6$ and helium is in a range of 0.01% (inclusive) to 1% (inclusive).

9. The plasma doping method according to claim 7, wherein a $B_2H_6$ gas concentration in the mixture gas plasma of $B_2H_6$ and helium is in a range of 0.025% (inclusive) to 0.6% (inclusive).

10. The plasma doping method according to claim 1, wherein the plasma of the gas containing the impurity is mixture gas plasma of $BF_3$ and helium.

11. The plasma doping method according to claim 1, wherein the first substrate and second substrate is a silicon substrate.

12. The plasma doping method according to claim 1, wherein the step of plasma-doping includes:
    a first doping step of plasma doping by setting the gas containing the impurity to a first concentration; and
    after the first doping step, a second doping step of plasma doping by setting the gas containing the impurity to a second concentration, the second concentration being smaller than the first concentration.

* * * * *